United States Patent
Xu

(10) Patent No.: US 12,033,313 B2
(45) Date of Patent: Jul. 9, 2024

(54) WAFER SAMPLE ANALYSIS METHOD AND DEVICE

(71) Applicant: CHANGXIN MEMORY TECHNOLOGIES, INC., Hefei (CN)

(72) Inventor: Gaofeng Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 378 days.

(21) Appl. No.: 17/597,614

(22) PCT Filed: Jul. 13, 2021

(86) PCT No.: PCT/CN2021/106119
§ 371 (c)(1),
(2) Date: Jan. 13, 2022

(87) PCT Pub. No.: WO2022/062583
PCT Pub. Date: Mar. 31, 2022

(65) Prior Publication Data
US 2022/0318988 A1    Oct. 6, 2022

(30) Foreign Application Priority Data

Sep. 28, 2020    (CN) .......................... 202011044823.6

(51) Int. Cl.
*G06T 7/00*    (2017.01)
*H01J 49/14*    (2006.01)

(52) U.S. Cl.
CPC .......... *G06T 7/0006* (2013.01); *H01J 49/142* (2013.01); *G06T 2207/30148* (2013.01)

(58) Field of Classification Search
CPC ............. H01L 31/0216; H01L 27/1462; H01L 29/2003; H01L 21/0254; G01N 21/8806; G01N 2/8806; G06T 7/0006; H01J 49/12
See application file for complete search history.

(56) References Cited

U.S. PATENT DOCUMENTS

| | | | |
|---|---|---|---|
| 6,576,894 B1 * | 6/2003 | Doong | G01N 23/22 250/282 |
| 8,552,369 B2 * | 10/2013 | Breil | G01N 23/2273 250/305 |
| 2012/0280124 A1 | 11/2012 | Breil | |
| 2021/0119126 A1 | 4/2021 | Kawakami et al. | |

FOREIGN PATENT DOCUMENTS

| | | |
|---|---|---|
| CN | 106290544 A | 1/2017 |
| CN | 104810239 B | 8/2017 |
| CN | 110402387 A | 11/2019 |
| JP | H0989820 A | 4/1997 |
| JP | 2015096817 A | 5/2015 |

* cited by examiner

*Primary Examiner* — Phuoc H Doan
(74) *Attorney, Agent, or Firm* — Syncoda LLC; Feng Ma

(57) ABSTRACT

A wafer sample analysis method includes: providing a wafer sample, the wafer sample at least including a slope configured to expose a substrate, a first protective layer and a first doped layer on a same surface, the first protective layer being formed on the substrate, and the first doped layer being formed on the first protective layer; and acquiring and analyzing a slope image of the slope to obtain a doping depth and a doping concentration of elements in the wafer sample in the slope image.

20 Claims, 7 Drawing Sheets

US 12,033,313 B2

WAFER SAMPLE ANALYSIS METHOD AND DEVICE

CROSS-REFERENCE TO RELATED APPLICATIONS

This application is a National Stage of International Application No. PCT/CN2021/106119 filed on Jul. 13, 2021, which claims priority to Chinese Patent Application No. 202011044823.6 filed on Sep. 28, 2020. The disclosures of these applications are hereby incorporated by reference in their entirety.

TECHNICAL FIELD

The present disclosure relates to a semiconductor detection technology, and in particular to a wafer sample analysis method and device.

BACKGROUND

A wafer refers to a silicon chip used in manufacturing of a silicon semiconductor integrated circuit. Since it is circular, the silicon chip is referred to as wafer. Various circuit element structures can be manufactured on the wafer to form semiconductor components with specific electrical functions. However, the doping of group III and group V elements in the wafer has a decisive effect on the electrical adjustment of the semiconductor components. Therefore, it is necessary to detect the types, the quantities and the distributions of the group III and group V elements in the wafer in the semiconductor industry.

At present, a secondary-ion-mass spectroscope (Sims for short) is usually used in the industry to detect the types, the quantities, and the distributions of the group III and group V elements in the wafer. The Sims uses a high-energy primary ion beam to bombard a surface of a sample, so that atoms or atomic groups on the surface of the sample absorb energy and are sputtered from the surface to generate secondary ions. These charged ions can be obtained after passing through a mass analyzer, so that a map of the surface information of the sample can be obtained. However, Sims analysis is to directly perform the ion beam bombardment on the surface of the wafer sample. Since the surface of the sample will be exposed to the air before Sims analysis, surface contamination will be caused. A surface effect may affect the collection of surface signals. With the increase of an ion sputtering depth, a sidewall effect will gradually increase, that is, ions on a sidewall of an ion beam bombardment part will be mixed with the ions that have been generated before, resulting in mixed ions. In the subsequent analysis process, the mixed ions have great influence on analysis of a doping depth of real elements. Therefore, an existing method for analyzing elements in a wafer sample has the problem of inaccurate analysis result.

SUMMARY

In a first aspect, the present disclosure provides a wafer sample analysis method applied to a secondary-ion-mass spectroscope (Sims). The method includes: providing a wafer sample, the wafer sample at least including a slope configured to expose a substrate, a first protective layer and a first doped layer on a same surface, the first protective layer being formed on the substrate, and the first doped layer being formed on the first protective layer; and acquiring and analyzing a slope image of the slope to obtain a doping depth and a doping concentration of elements in the wafer sample in the slope image.

In a second aspect, the present disclosure provides a wafer sample analysis device, comprising: a processor, configured to acquire a slope image of a slope and analyze the slope image to obtain a doping depth and a doping concentration of elements in a wafer sample in the slope image; herein the wafer sample at least comprises the slope configured to expose a substrate, a first protective layer and a first doped layer on a same surface; the first protective layer is formed on the substrate; and the first doped layer is formed on the first protective layer.

DETAILED DESCRIPTION

Exemplary embodiments will be described in detail herein, examples of which are illustrated in the accompanying drawings. When the following description refers to the accompanying drawings, the same numbers in different drawings represent the same or similar elements unless otherwise indicated. The implementation modes described in the following exemplary embodiments do not represent all embodiments consistent with the present disclosure. Rather, they are merely examples of devices and methods consistent with some aspects of the present disclosure as detailed in the appended claims.

An existing SIMS method for analyzing doped elements in a wafer sample has the problem of inaccurate analysis results. Based on this, the present disclosure provides a wafer sample analysis method applied to a secondary-ion-mass spectroscopy (Sims). The wafer sample analysis method provides a wafer sample including a slope, obtains an image of the slope of the wafer sample, analyzes the image of the slope by ion beam bombardment to generate secondary ions, and analyzes the secondary ions to obtain an element doping depth of the wafer sample and a map of element doping concentrations corresponding to different depths. Since the image of the slope includes a multi-layer cross-sectional image in the wafer sample. At this time, the doping depth of the elements in the wafer sample and the corresponding element doping concentration can be determined without bombarding the wafer sample by using a method of continuously increasing a bombardment depth by an ion beam, so that no sidewall effect will be generated, and an obtained analysis result on the elements in the sample is more accuracy. In addition, in the wafer sample analysis method provided in the present disclosure, a first protective layer and a first doped layer are also formed on a substrate of the wafer sample. The protective layer can effectively prevent the surface contamination on the wafer sample, thereby making the analysis result of the elements in the wafer sample more accurate. It should be noted that analysis of the elements in the wafer sample includes analysis of a doping type of the elements, analysis of a doping depth, and analysis of a doping concentration.

Figure 1:
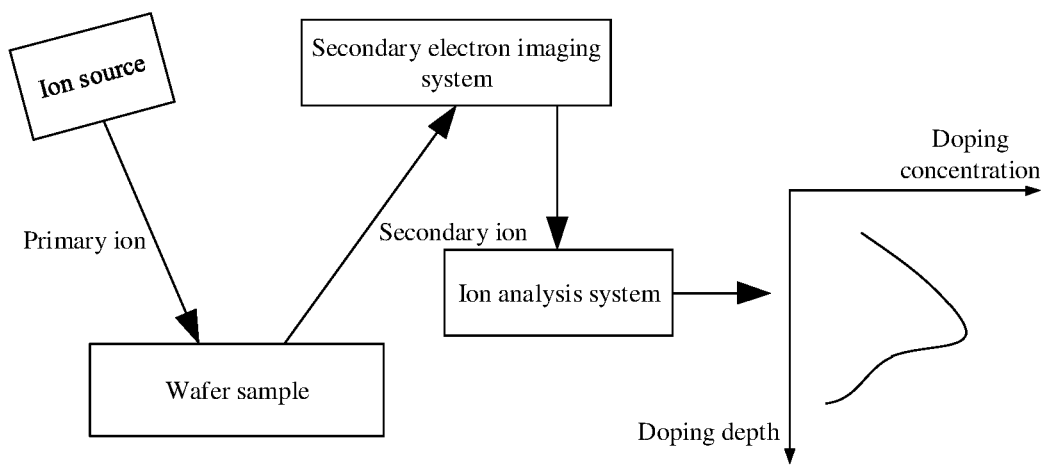
FIG. 1 is a schematic diagram of application of a secondary-ion-mass spectroscope provided by the present disclosure.

Referring to FIG. 1, the wafer sample analysis method provided in the present disclosure is applied to the Sims which includes an ion source and a secondary electron imaging system. The ion source generates primary ions which bombard the slope of the wafer sample to generate secondary ions. The secondary electron imaging system is configured to generate a secondary electron image of the secondary ion, that is, the image of the slope of the wafer sample. An element analysis system in the Sims then analyzes the image of the slope and determines the doping depth and the doping concentration of the elements in the wafer sample.

Figure 2:
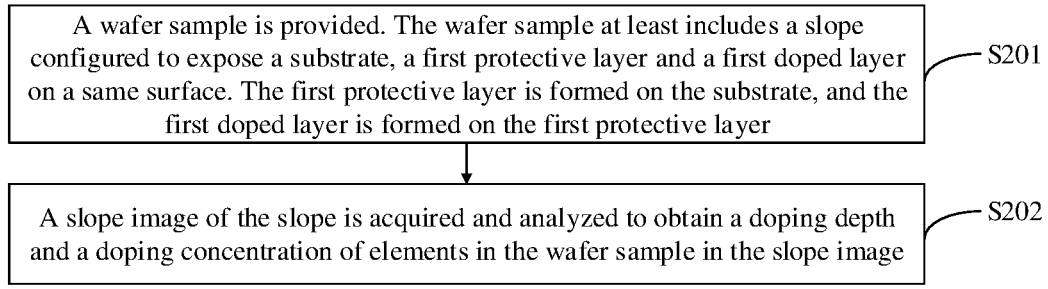
FIG. 2 is a flowchart of a wafer sample analysis method provided by an embodiment of the present disclosure.

Referring to FIG. 2 together, the present disclosure provides a wafer sample analysis method applied to a Sims. The method includes as follows.

At S201, a wafer sample is provided. The wafer sample at least includes a slope configured to expose a substrate, a first protective layer and a first doped layer on a same surface. The first protective layer is formed on the substrate, and the first doped layer is formed on the first protective layer.

Figure 3:
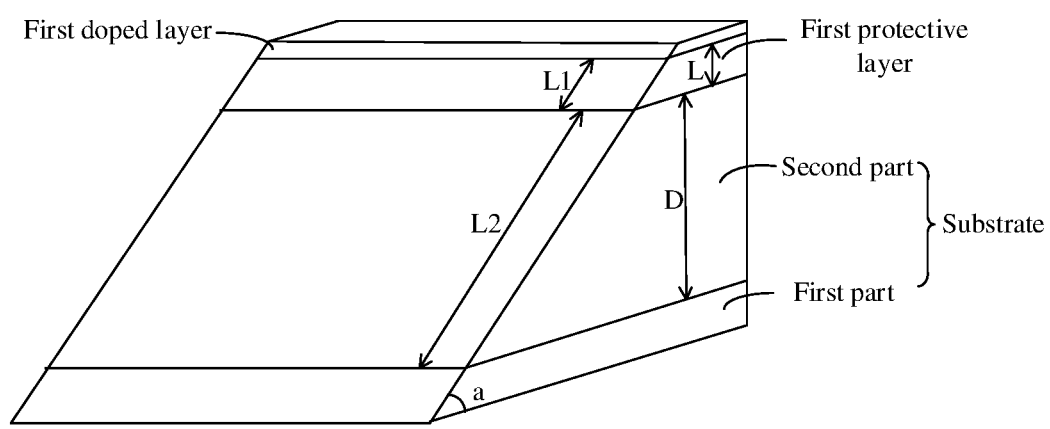
FIG. 3 is a schematic diagram of a wafer sample provided by an embodiment of the present disclosure.

Referring to FIG. 3 together, the slope can be obtained by grinding and polishing the wafer sample. The slope is configured to expose the substrate, the first protective layer and the first doped layer of the wafer sample on the same surface. The first protective layer is formed on the substrate. The first doped layer is formed on the first protective layer. The first protective layer is configured to prevent a surface of the wafer sample from being contaminated. The first doped layer is configured to mark a position of a surface of the first protective layer. A thickness of the first protective layer and a thickness of the first doped layer can be selected according to actual needs, and is not limited in the present disclosure. In an optional embodiment, the first protective layer may be a film formed by a compound of silicon. The shape of the slope of the wafer sample obtained after grinding and polishing should meet the sample specifications of the Sims. An included angle between the slope and a plane where the substrate is disposed can be selected according to actual needs, and is not limited in the present disclosure.

At S202, a slope image of the slope is acquired and analyzed to obtain a doping depth and a doping concentration of elements in the wafer sample in the slope image.

A secondary electron imaging system is set in the Sims, and the slope image is obtained by the secondary electron imaging system through analyzing the secondary ions sputtered on the slope. The slope image may be an image of the entire slope, or an image of a bombardment region selected by staff according to actual needs. For example, the staff first selects a region to be bombarded by an ion beam on the slope, and then selects an image collected in the preset region of the slope after the ion beam bombardment as the slope image. After obtaining the slope image, the element analysis system in the secondary ion mass spectrometer uses the slope image to determine the doping depth of the elements in the wafer sample and the doping concentration corresponding to different doping depths. The element doping refers to doping of group III elements and group V elements in the wafer sample. If the slope image is the whole image of the slope, the finally determined doping depth and doping concentration are the doping depth and doping concentration of all the elements within the whole slope range after the slope bombardment by the ion beam. If the slope image is only an image of the region bombarded by the ion beam and selected by the staff on the slope, the finally determined doping depth and the doping concentration are the doping depth and doping concentration of elements of the image of the region selected by the staff.

After the staff dopes group III elements and group V elements into the wafer, the staff needs to acquire element doping depths and element doping concentrations corresponding to different depths. In the wafer sample analysis method provided by the present embodiment, at least one slope that exposes the substrate, the first protective layer and the first doped layer of the wafer sample is prepared on the wafer sample to be analyzed. Then, an analysis result diagram of the doping depth and doping concentration of the elements in the wafer sample is obtained by analyzing the slope image of the wafer sample. Since the slope image is an image acquired by the Sims directly bombarding the slope of the wafer sample with an ion beam, the slope image includes element distribution information of all layers of the wafer sample. Therefore, unlike the result in the existing art that as the ion sputtering depth increases, the elements on a sidewall of an ion beam impact part are mixed with the elements generated by a high-energy ion beam impact part, the slope image obtained in the present disclosure does not have the problem of element mixing interference. The element analysis results, i.e., the element doping depth and the element doping concentration, obtained through the analysis of the slope image are more accurate. In addition, the first protective layer and the first doped layer provided in the present disclosure can also solve the problem of inaccurate element analysis results caused by the surface contamination of wafer sample.

In an embodiment of the present disclosure, the substrate includes a first part and a second part. The first part is monocrystalline silicon and the second part is doped monocrystalline silicon. The first protective layer is formed on the doped monocrystalline silicon. After the slope image is acquired, it is mainly to analyze the doping depth and doping concentration of the elements doped in the second part.

Figure 4:
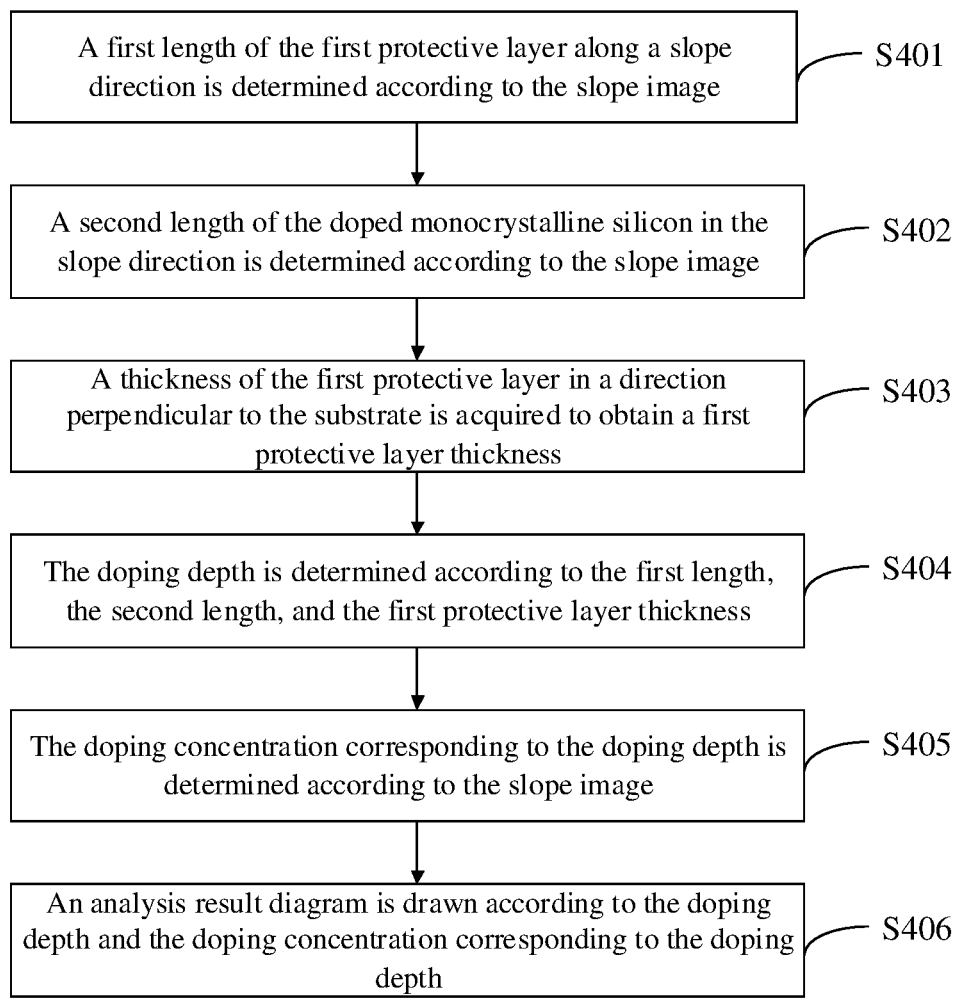
FIG. 4 is a flowchart of a wafer sample analysis method provided by another embodiment of the present disclosure.

Referring to FIG. 4 together, operation S202 includes as follows.

At S401, a first length of the first protective layer along a slope direction is determined according to the slope image.

As illustrated in FIG. 3, an extending direction of a line where the slope is intersected with a sidewall of the wafer sample is the slope direction, and a plane where the sidewall is disposed is perpendicular to a plane where the substrate and the first protective layer are disposed. The first length is L1 illustrated in FIG. 3.

At S402, a second length of the doped monocrystalline silicon in the slope direction is determined according to the slope image.

The second length is L2 illustrated in FIG. 3. Both the first length and the second length can be measured by the Sims through the slope image.

At S403, a thickness of the first protective layer in a direction perpendicular to the substrate is acquired to obtain a first protective layer thickness.

The first protective layer thickness can be measured by the staff.

At S404, the doping depth is determined according to the first length, the second length, and the first protective layer thickness.

A computing program is set in the Sims, and the staff can input the first protective layer thickness into the computing program. A computing formula is set in the computing program: D=L1/L2×L. Where D represents the doping depth of the elements in the wafer sample; L1 represents the first length; L2 represents the second length; and L represents the first protective layer thickness. The computing program in the Sims can determine the doping depth of the elements in the wafer sample.

At S405, the doping concentration corresponding to the doping depth is determined according to the slope image.

The slope image is a secondary electron image. The Sims can determine doping concentration data corresponding to each depth data in the doping depth according to the secondary electron image.

At S406, an analysis result diagram is drawn according to the doping depth and the doping concentration corresponding to the doping depth.

Figure 5:
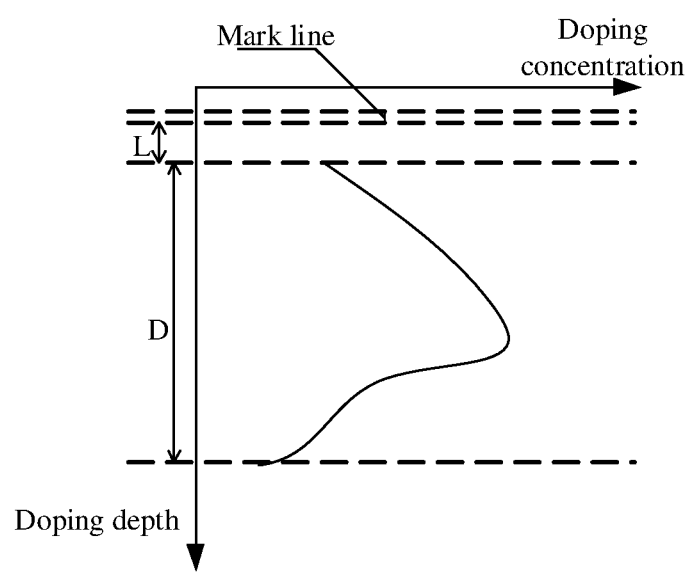
FIG. 5 is a schematic diagram of an analysis result diagram provided by an embodiment of the present disclosure.

Referring to FIG. 5 together, the Sims can draw this analysis result diagram through analysis software according to the determined doping depth of the elements in the wafer sample and the doping concentration corresponding to different doping depths. The analysis software is Win Image and Win Curve data processing software, for example. The x-coordinate of the analysis result diagram may be the doping concentration of the elements, and the longitudinal coordinate of the analysis result diagram may be the doping depth of the elements. The analysis result diagram displays a plurality of data of the doping depth, a plurality of data of the doping depth, and correspondence relationships between the plurality of data of the doping depth and the plurality of data of the doping concentration in the form of a curve. The doping depth corresponding to the maximum doping concentration of the elements in the wafer sample can also be acquired through the analysis result diagram. If the slope image is an image of a partial region on the slope selected by the staff, the image of the partial region is defined as a preset region image. The preset region image corresponds to a preset depth region, and the staff can determine a doping concentration region of the elements corresponding to the preset depth region through the analysis result diagram. That is, after the preset depth region is selected on the longitudinal coordinate of the analysis result diagram, a doping concentration region of the elements corresponding to the preset depth region can be correspondingly determined.

In an optional embodiment, the analysis result diagram can also be replaced with an analysis result table or other data display forms, as long as the doping depth and corresponding doping concentration of the elements in the wafer sample can be displayed.

Figure 6:
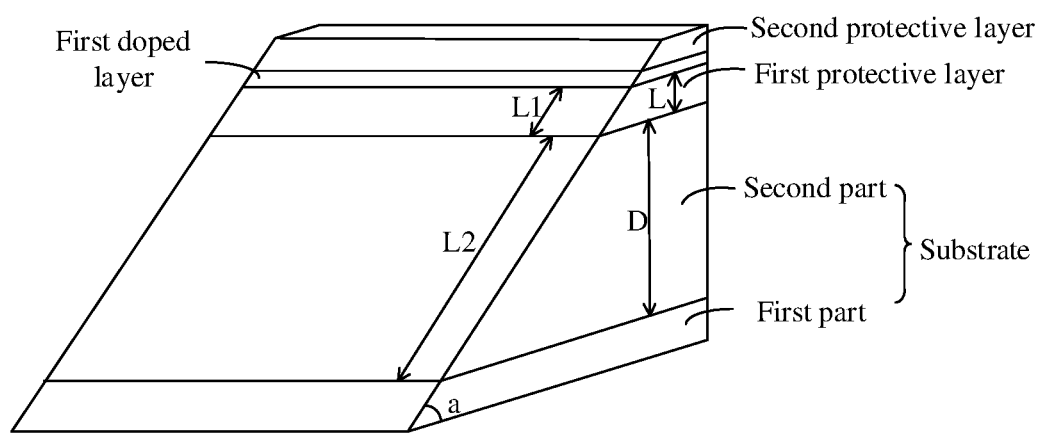
FIG. 6 is a schematic diagram of a wafer sample provided by another embodiment of the present disclosure.

Referring to FIG. 6, in an embodiment of the present disclosure, the wafer sample further includes a second protective layer formed on the first doped layer. Element compositions of the second protective layer and the first protective layer may be the same. The first protective layer and the second protective layer may include compounds of silicon. A thickness of the second protective layer can be selected according to actual needs, which is not limited in the present disclosure. The second protective layer can ensure that the analysis results are more accurate.

In an embodiment of the present disclosure, the first doped layer is formed on the first protective layer by using a low-pressure chemical vapor deposition method. The first doped layer includes a boron element. The first doped layer is configured to mark a position of a surface of the first protective layer. As illustrated in FIG. 5, the analysis result diagram can show mark lines of an element depth and concentration of the first doped layer and show the position of the surface of the first protective layer marked by the first doped layer. The first doped layer can also prevent the surface of the first protective layer from being contaminated, thereby improving the accuracy of the analysis results of the doping depth of the elements in the wafer sample and the corresponding doping concentration. The boron element in the first doped layer can also be replaced with other elements, as long as the function of marking the surface position of the first protective layer can be achieved.

In an embodiment of the present disclosure, a neutralization doping concentration of the wafer sample is generated by ion beam bombardment with preset energy. The preset energy can be set by the staff, and a setting principle is to increase the spatial resolution of the slope image.

In an embodiment of the present disclosure, the included angle between the slope and a plane where the substrate is disposed is less than or equal to 10 degrees. As illustrated in FIG. 6, the angle a is less than or equal to 10 degrees. If the slope can more completely show a cross section of the wafer sample, the doping depth and the doping concentration of the elements in the wafer sample can be reflected more completely and accurately according to the acquired slope image of the slope.

Figure 7:
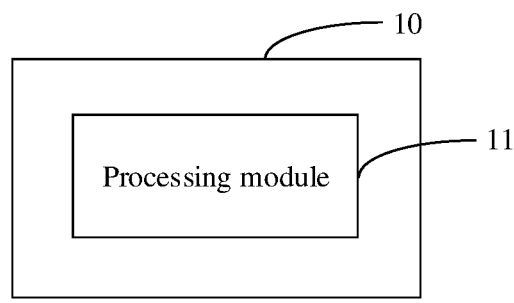
FIG. 7 is a flowchart of a wafer sample analysis device provided by an embodiment of the present disclosure.

Referring to FIG. 7, the present disclosure provides a wafer sample analysis device 10, which includes a processing module 11, configured to acquire a slope image of a slope and analyze the slope image to obtain a doping depth and doping concentration of elements in a wafer sample in the slope image.

The wafer sample at least includes the slope configured to expose a substrate, a first protective layer and a first doped layer on a same surface. The first protective layer is formed on the substrate, and the first doped layer is formed on the first protective layer.

The substrate includes a first part and a second part. The first part is monocrystalline silicon and the second part is doped monocrystalline silicon. The first protective layer is formed on the doped monocrystalline silicon.

The wafer sample also includes a second protective layer formed on the first doped layer.

The first protective layer and the second protective layer include compounds of silicon.

The first doped layer is formed on the first protective layer by using a low-pressure chemical vapor deposition method. The first doped layer includes a boron element.

The doping concentration in the wafer sample is generated by ion beam bombardment with preset energy.

An included angle between the slope and a plane where the substrate is disposed is less than or equal to 10 degrees.

The processing module is specifically configured to: determine a first length of the first protective layer in a slope direction according to the slope image; determine a second length of the doped monocrystalline silicon in the slope direction according to the slope image; acquire a thickness of the first protective layer in a direction perpendicular to the substrate to obtain a first protective layer thickness; determine the doping depth according to the first length, the second length, and the first protective layer thickness; determine the doping concentration corresponding to the doping depth according to the slope image; and draw an analysis result diagram according to the doping depth and the doping concentration corresponding to the doping depth.

It should be noted that terms "include", "including" or any other variants thereof herein are meant to cover non-exclusive inclusions, so that a process, method, object or device that includes a series of elements not only includes those elements, but also includes other elements which are not definitely listed, or further includes inherent elements of this process, method, object or device.

The serial numbers of the embodiments of the present disclosure are only for description, and do not represent the quality advantages and disadvantages of the embodiments.

Those skilled in the art will easily think of other implementation solutions of the present disclosure after considering the specification and practicing the invention disclosed here. The present disclosure is intended to cover any variations, uses, or adaptive changes of the present disclosure. These variations, uses, or adaptive changes follow the general principles of the present disclosure and include common general knowledge or conventional technical means in the technical field, which are not disclosed herein. The specification and the embodiments are considered as being exemplary only, with a true scope and spirit of the present disclosure being indicated by the following claims.

It should be understood that the present disclosure is not limited to the precise structure that has been described above and shown in the drawings, and various modifications and changes can be made without departing from the scope thereof. The scope of the present disclosure is limited only by the appended claims.

What is claimed is:

1. A wafer sample analysis method, applied to a secondary-ion-mass spectroscope (Sims), comprising:
providing a wafer sample; wherein the wafer sample at least includes a slope configured to expose a substrate, a first protective layer and a first doped layer on a same surface, the first protective layer is formed on the substrate, and the first doped layer is formed on the first protective layer; and
acquiring and analyzing a slope image of the slope to obtain a doping depth and a doping concentration of elements in the wafer sample in the slope image.

2. The method of claim 1, wherein the substrate comprises a first part and a second part, wherein the first part is monocrystalline silicon, the second part is doped monocrystalline silicon; and the first protective layer is formed on the doped monocrystalline silicon.

3. The method of claim 2, wherein the acquiring and analyzing the slope image of the slope to obtain the doping depth and the doping concentration of elements in the wafer sample in the slope image comprises:
determining a first length of the first protective layer in a slope direction according to the slope image;
determining a second length of the doped monocrystalline silicon in the slope direction according to the slope image;
acquiring a thickness of the first protective layer in a direction perpendicular to the substrate to obtain a first protective layer thickness;
determining the doping depth according to the first length, the second length, and the first protective layer thickness;
determining the doping concentration corresponding to the doping depth according to the slope image; and
drawing an analysis result diagram according to the doping depth and the doping concentration corresponding to the doping depth.

4. The method of claim 2, wherein the wafer sample further comprises a second protective layer formed on the first doped layer.

5. The method of claim 4, wherein the first protective layer and the second protective layer comprise compounds of silicon.

6. The method of claim 2, wherein the first doped layer is formed on the first protective layer by using a low-pressure chemical vapor deposition method, and the first doped layer comprises a boron element.

7. The method of claim 2, wherein the doping concentration in the wafer sample is generated by ion beam bombardment with preset energy.

8. The method of claim 2, wherein an included angle between the slope and a plane where the substrate is disposed is less than or equal to 10 degrees.

9. A wafer sample analysis device, comprising:
a processor, configured to acquire a slope image of a slope and analyze the slope image to obtain a doping depth and a doping concentration of elements in a wafer sample in the slope image;
wherein the wafer sample at least comprises the slope configured to expose a substrate, a first protective layer and a first doped layer on a same surface; the first protective layer is formed on the substrate; and the first doped layer is formed on the first protective layer.

10. The wafer sample analysis device of claim 9, wherein the substrate comprises a first part and a second part; wherein the first part is monocrystalline silicon, the second part is doped monocrystalline silicon; and the first protective layer is formed on the doped monocrystalline silicon.

11. The wafer sample analysis device of claim 10, wherein the processor is configured, in response to acquiring and analyzing the slope image of the slope to obtain the doping depth and the doping concentration of elements in the wafer sample in the slope image, to:
determine a first length of the first protective layer in a slope direction according to the slope image;
determine a second length of the doped monocrystalline silicon in the slope direction according to the slope image;
acquire a thickness of the first protective layer in a direction perpendicular to the substrate to obtain a first protective layer thickness;
determine the doping depth according to the first length, the second length, and the first protective layer thickness;
determine the doping concentration corresponding to the doping depth according to the slope image; and
draw an analysis result diagram according to the doping depth and the doping concentration corresponding to the doping depth.

12. The wafer sample analysis device of claim 10, wherein the wafer sample further comprises a second protective layer formed on the first doped layer.

13. The wafer sample analysis device of claim 12, wherein the first protective layer and the second protective layer comprise compounds of silicon.

14. The wafer sample analysis device of claim 10, wherein the first doped layer is formed on the first protective layer by using a low-pressure chemical vapor deposition method, and the first doped layer comprises a boron element.

15. The wafer sample analysis device of claim 11, wherein the first doped layer is formed on the first protective layer by using a low-pressure chemical vapor deposition method, and the first doped layer comprises a boron element.

16. The wafer sample analysis device of claim 10, wherein the doping concentration in the wafer sample is generated by ion beam bombardment with preset energy.

17. The wafer sample analysis device of claim 10, wherein an included angle between the slope and a plane where the substrate is disposed is less than or equal to 10 degrees.

18. The wafer sample analysis device of claim 11, wherein an included angle between the slope and a plane where the substrate is disposed is less than or equal to 10 degrees.

19. The method of claim 3, wherein the first doped layer is formed on the first protective layer by using a low-pressure chemical vapor deposition method, and the first doped layer comprises a boron element.

20. The method of claim 3, wherein an included angle between the slope and a plane where the substrate is disposed is less than or equal to 10 degrees.

* * * * *